(12) United States Patent
Higashijima et al.

(10) Patent No.: US 8,590,547 B2
(45) Date of Patent: Nov. 26, 2013

(54) LIQUID PROCESSING APPARATUS

(75) Inventors: Jiro Higashijima, Koshi (JP); Hiromitsu Namba, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 1162 days.

(21) Appl. No.: 12/506,506

(22) Filed: Jul. 21, 2009

(65) Prior Publication Data

US 2010/0018557 A1 Jan. 28, 2010

(30) Foreign Application Priority Data

Jul. 24, 2008 (JP) .................................. 2008-191344

(51) Int. Cl.
*B08B 3/10* (2006.01)

(52) U.S. Cl.
USPC ............ 134/48; 134/94.1; 134/95.1; 134/902

(58) Field of Classification Search
USPC .............................. 134/48, 50, 94.1, 95.1, 902
See application file for complete search history.

(56) References Cited

U.S. PATENT DOCUMENTS

| | | | | |
|---|---|---|---|---|
| 6,165,552 | A * | 12/2000 | Anai et al. ................... | 427/240 |
| 6,306,455 | B1 * | 10/2001 | Takamori et al. ............. | 427/8 |
| 2002/0025375 | A1 * | 2/2002 | Takamori et al. ............. | 427/240 |
| 2003/0084925 | A1 * | 5/2003 | Nakajima et al. ............. | 134/26 |
| 2004/0050491 | A1 * | 3/2004 | Miya et al. ................ | 156/345.11 |
| 2007/0289528 | A1 * | 12/2007 | Nanba et al. ................. | 118/52 |

FOREIGN PATENT DOCUMENTS

| | | |
|---|---|---|
| JP | 08-001064 A1 | 1/1996 |
| JP | 2000-077378 A1 | 3/2000 |
| JP | 2002-110626 A1 | 12/2002 |
| JP | 2003-286597 A1 | 10/2003 |
| JP | 2004-265912 A1 | 9/2004 |
| JP | 2008-117971 A1 | 5/2008 |

OTHER PUBLICATIONS

Japanese Office Action (with English Translation) dated Mar. 2, 2012.

* cited by examiner

*Primary Examiner* — Michael Barr
*Assistant Examiner* — Benjamin L Osterhout
(74) *Attorney, Agent, or Firm* — Burr & Brown

(57) ABSTRACT

A liquid processing apparatus processes a lower surface and a side surface of an object to be processed W. The liquid processing apparatus includes: a process-liquid supply mechanism configured to supply a process liquid to the object to be processed; a drain mechanism configured to drain the process liquid having processed the object to be processed W; a rotational cup disposed circumferentially outward the object to be processed W, the rotational cup being configured to guide the process liquid having processed the object to be processed W to the drain mechanism; and a driving part configured to rotate the rotational cup. The rotational cup is provided with a support part that projects circumferentially inward so as to support a circumferential part of the object to be processed W.

9 Claims, 6 Drawing Sheets

LIQUID PROCESSING APPARATUS

CROSS REFERENCE TO RELATED APPLICATIONS

This application is based upon and claims the benefit of priority from the prior Japanese Patent Application No. 2008-191344 filed on Jul. 24, 2008, the entire contents of which are incorporated herein by reference.

BACKGROUND OF THE INVENTION

1. Field Of the Invention

The present invention relates to a liquid processing apparatus configured to process a lower surface and a side surface of an object to be processed such as a semiconductor wafer.

2. Description of Related Art

There has been conventionally known a bevel etching apparatus (liquid processing apparatus) that selectively etches a circumferential part of an upper surface and a lower surface of a substrate (object to be processed), by supplying a gas onto the upper surface of the substrate and simultaneously supplying an etching liquid onto the lower surface of the substrate (see, JP2002-110626A). The bevel etching apparatus (liquid processing apparatus) described in JP2002-110626A includes: a substrate holding and rotating means configured to rotate a substrate while holding the substrate in a substantially horizontal direction; an etching-liquid supply means configured to supply an etching liquid onto a lower surface of the substrate that is rotated by the substrate holding and rotating means; and a block plate (top plate) that is placed on the substrate holding and rotating means with a predetermined gap between the block plate and an upper surface of the substrate and is rotated together with the substrate by the substrate holding and rotating means. The block plate has an opening through which a gas for controlling a shifting of the etching liquid from the lower surface of the substrate to the upper surface thereof is supplied onto the upper surface of the substrate.

However, in the conventional technique disclosed in JP2002-110626A, the shifting of the etching liquid from the lower surface of the substrate to the upper surface thereof is not sufficiently prevented, and the spattering of the etching liquid from a circumferential part of the substrate is not sufficiently restrained.

SUMMARY OF THE INVENTION

The present invention has been made in consideration of such circumstances. The present invention provides a liquid processing apparatus in which a rotational cup for guiding a process liquid, which has processed an object to be processed, to a drain mechanism disposed at a position near to the object to be processed, such that a gap between the object to be processed supported by a support part and the rotational cup can be made uniform.

The liquid processing apparatus according to an aspect of the present invention is configured to process a lower surface and a side surface of an object to be processed, the liquid processing apparatus comprising:

a process-liquid supply mechanism configured to supply a process liquid to the object to be processed;

a drain mechanism configured to drain the process liquid having processed the object to be processed;

a rotational cup disposed circumferentially outward the object to be processed, the rotational cup being configured to guide the process liquid having processed the object to be processed to the drain mechanism;

a support part disposed on the rotational cup so as to project circumferentially inward, the support part being configured to support a circumferential part of the object to be processed; and a driving part configured to rotate the rotational cup.

According to the present invention, the rotational cup is provided with the support part that projects circumferentially inward so as to support a circumferential part of the object to be processed. Thus, the rotational cup for guiding the process liquid, which has processed the object to be processed, to the drain mechanism can be disposed on a position near to the object to be processed. In addition, a gap between the object to be processed supported by the support part and the rotational cup can be made uniform. Therefore, the process liquid can be restrained from spattering from the circumferential part of the object to be processed. The process liquid can be prevented from shifting from the lower surface of the object to be processed to the upper surface thereof.

DETAILED DESCRIPTION OF THE INVENTION

First Embodiment

A first embodiment of the liquid processing apparatus according to the present invention is described with reference to the drawings. FIGS. 1 to 5 show the first embodiment of the present invention.

Figure 1:
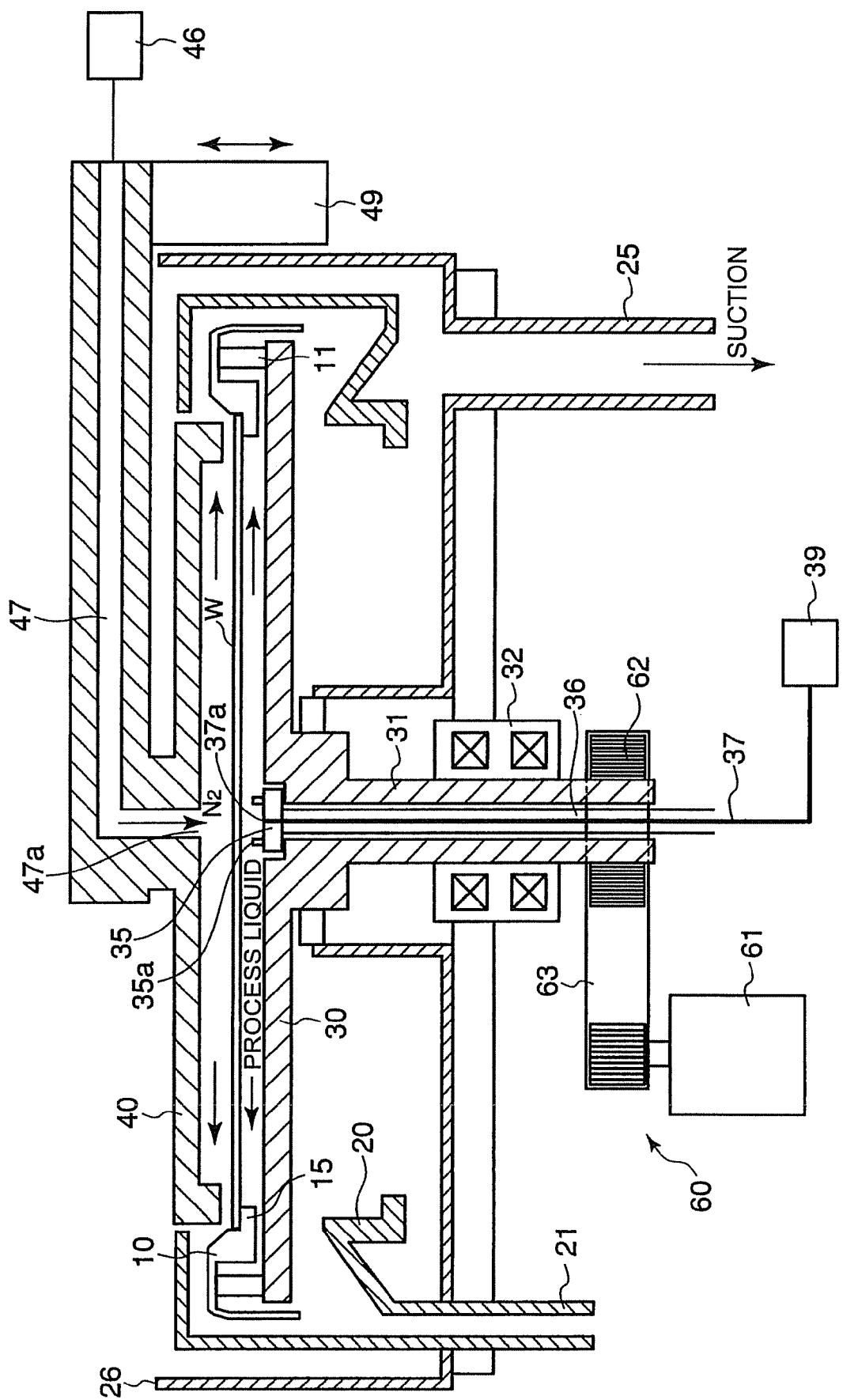
FIG. 1 is a schematically sectional view showing a structure of a liquid processing apparatus in a first embodiment of the present invention.

As shown in FIG. 1, the liquid processing apparatus in this embodiment is configured to supply a process liquid onto a lower surface and a side surface of an object to be processed such as a semiconductor wafer W (hereinafter referred to as "wafer W"), so as to clean the lower surface and the side surface of the wafer W. Herein, the process liquid means a chemical liquid and a deionized water (rinse liquid). As a chemical liquid, there may used a hydrofluoric-acid liquid and a mixed solution of nitric acid and hydrofluoric acid.

As shown in FIG. 1, the liquid processing apparatus includes: process-liquid supply mechanisms 37 and 39 configured to supply a process liquid to a lower surface of a wafer W; drain mechanisms 20 and 21 configured to drain the process liquid having processed the wafer W; and a rotational cup 10 disposed circumferentially outward the wafer W, the rotational cup 10 configured to guide the process liquid having processed the wafer W to the drain mechanisms 20 and 21.

As shown in FIG. 1, the process-liquid supply mechanisms 37 and 39 include a process-liquid supply part 39 for supplying a process liquid, and a process-liquid supply pipe 37 for guiding the process liquid supplied from the process-liquid supply part 39 toward a lower surface of the wafer W. An upper surface of the process-liquid supply pipe 37 forms a process-liquid supply port 37*a*.

As shown in FIG. 1, the drain mechanisms 20 and 21 include a drained-liquid cup 20 for receiving the process liquid guided by the rotational cup 10, and a liquid discharging pipe 21 for discharging the process liquid received by the drained-liquid cup 20. An exhaust cup 26 is disposed around the drained-liquid cup 20. Connected to the exhaust cup 26 is an exhaust pipe 25 for sucking and discharging a gas such as a nitrogen gas in the exhaust cup 26. A drain and suction part (not shown) for imparting a suction force is coupled to the exhaust pipe 25.

Figure 2:
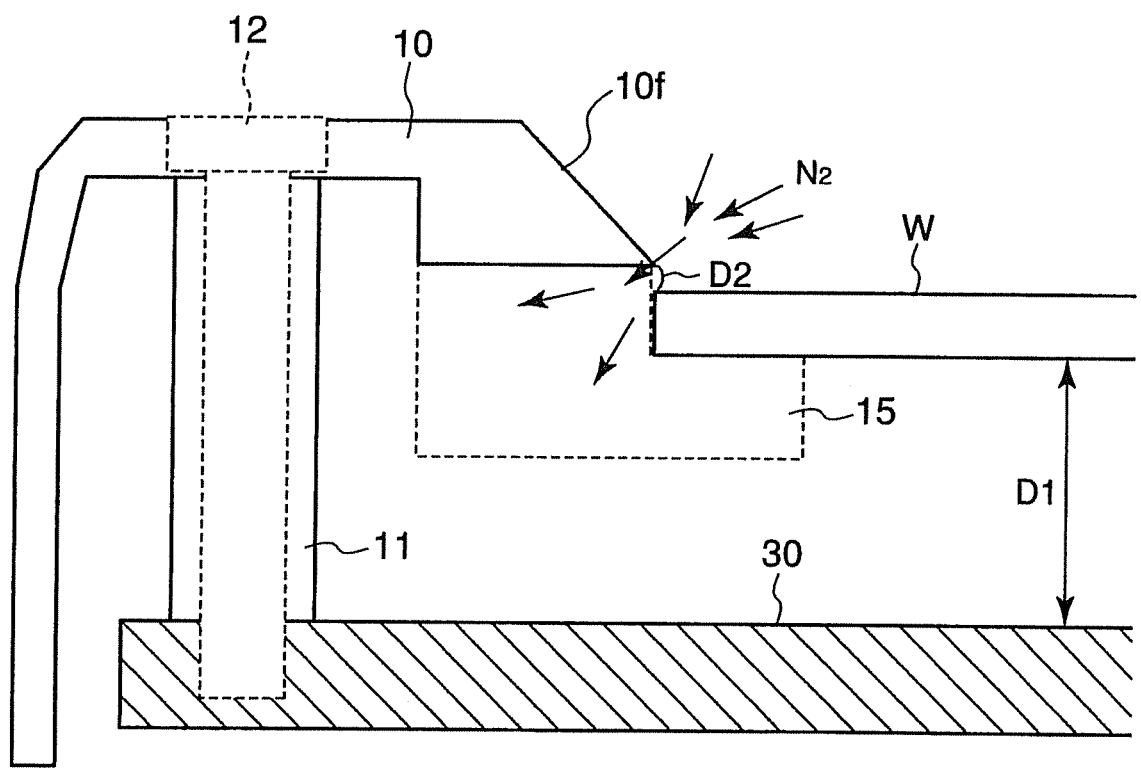
FIG. 2 is a schematically enlarged sectional view showing a rotational cup of the liquid processing apparatus in the first embodiment of the present invention and a vicinity of the rotational cup.
Figure 3:
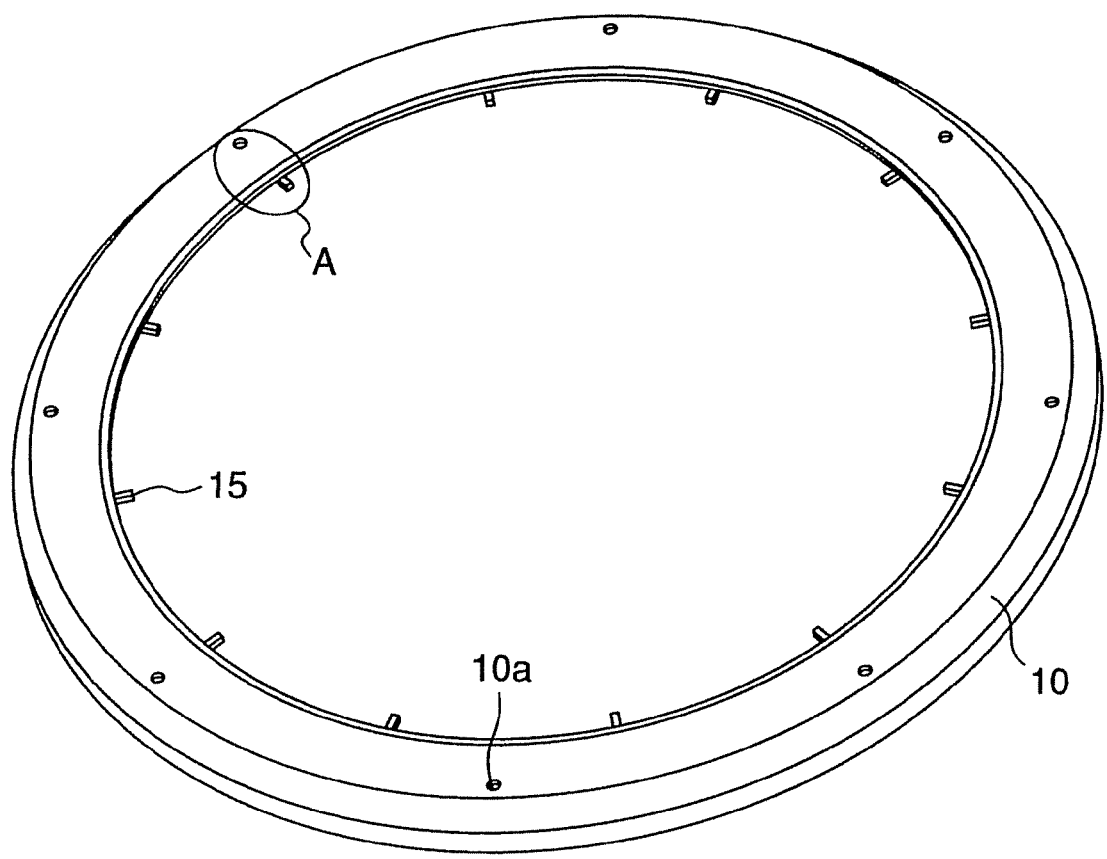
FIG. 3 is a perspective view of the rotational cup of the liquid processing apparatus in the first embodiment of the present invention.
Figure 4:
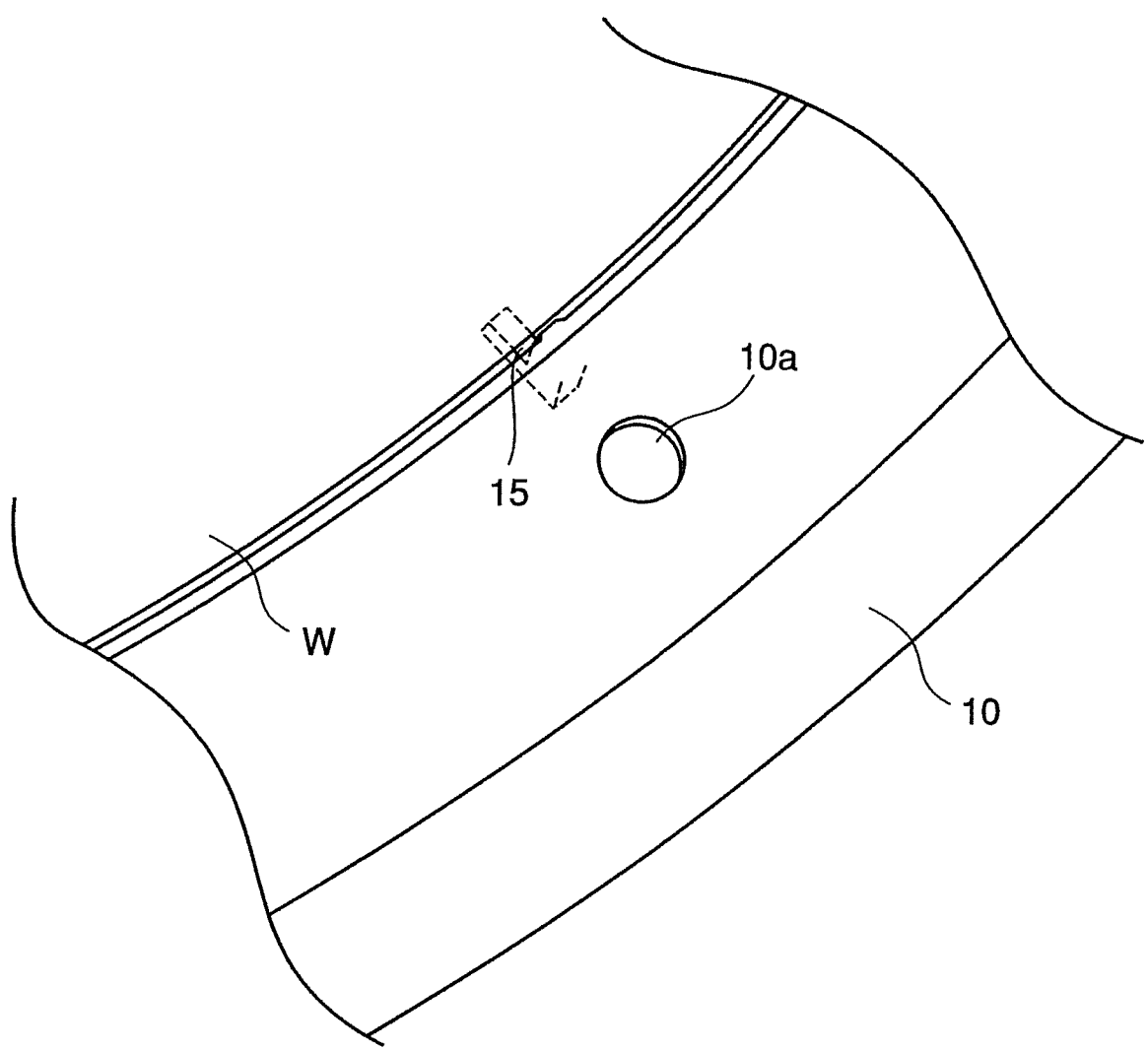
FIG. 4 is an enlarged perspective view showing the part A in FIG. 3.

As shown in FIGS. 1 to 4, arranged on a lower end of the rotational cup 10 are a plurality of support pins (support parts) 15 that project circumferentially inward so as to support a circumferential part of the lower surface of the wafer W. FIG. 4 is an enlarged sectional view showing the part A in FIG. 3.

As shown in FIG. 1, a top plate 40 is disposed above the upper surface of the wafer W supported by the support pins 15 so as to cover the wafer W. Inside the top plate 40, there is extended an inert-gas supply pipe 47 connected to an inert-gas supply part 46 for supplying an inert gas such as a nitrogen gas and an argon gas (nitrogen gas in this embodiment). An end of the inert-gas supply pipe 47 is opened to a central part of the top plate 40, and the end forms an inert-gas supply port 47*a*. In this embodiment, the inert-gas supply pipe 47 connected to the inert-gas supply part 46 forms an inert-gas supply mechanism being configured to supply an inert gas to a gap D2 between the wafer W and the rotational cup 10. As shown in FIG. 1, coupled to the top plate 40 is a top-plate driving part 49 configured to move the top plate 40 in an up and down direction.

As shown in FIG. 1, a hollow base plate (base) 30 is disposed below the rotational cup 10. A hollow rotational shaft 31 extending downward is disposed on the base plate 30. Coupled to the rotational shaft 31 is a rotary driving part (driving part) 60 for rotating the rotational shaft 31. By rotating the rotational shaft 31, the base plate 30 and the rotational cup 10 can be rotated, whereby the wafer W on the support pins 15 disposed on the rotational cup 10 can be rotated.

As shown in FIG. 1, the rotary driving part 60 includes: a pulley 62 disposed circumferentially outward the rotational shaft 31; a driving belt 63 wound around the pulley 62; and a motor 61 for imparting a driving force to the driving belt 63 so as to rotate the rotational shaft 31 through the pulley 62. A bearing 32 is disposed on a position outward the periphery of the rotational shaft 31.

As shown in FIG. 1, disposed in the hollow parts of the base plate 30 and the rotational shaft 31 are a hollow lift-pin plate 35 having lift pins 35*a*, and a hollow lift shaft 36 extending downward from the lift-pin plate 35. As shown in FIG. 1, the process-liquid supply pipe 37 is extended in the up and down direction through the insides (in the hollow spaces) of the lift-pin plate 35 and the lift shaft 36. Coupled to the lift shaft 36 is a lift-shaft driving part (not shown) configured to move the lift shaft 36 in the up and down direction.

As shown in FIG. 2, a spacer 11 is positioned between the base plate (base) 30 and the rotational cup 10. In the spacer 11, there is disposed a fastening member 12 such as a screw for fastening the rotational cup 10 and the base plate 30 to each other. As shown in FIGS. 3 and 4, the rotational cup 10 is provided with a hole part 10*a* through which the fastening member 12 can pass.

In this embodiment, the support pins (support part) 15 and the rotational cup 10 are formed integrally with each other to provide an integral structure. In addition, the spacer 11 and the rotational cup 10 are formed integrally with each other to provide an integral structure.

Next, an operation of this embodiment as structured above is described.

At first, a wafer W taken out from a carrier (not shown) by a transfer robot (not shown) is placed on the lift pins 35*a* of the lift-pin plate 35 that are positioned at a transfer position (lifted position) by the lift-shaft driving part (not shown). At this time, the top plate 40 is positioned by the top-plate driving part 49 at an upper position other than the transfer position of the wafer W.

Then, the lift-pin plate 35 is moved downward by the lift-pin driving part (not shown) so as to be located at a position where a wafer is processed (see, FIG. 1). In the course of the downward movement of the lift-pin plate 35, a lower surface of the wafer W is supported by the support pins 15 disposed on the rotational cup 10. Thereafter, the top plate 40 is positioned at a lowered position by the top-plate driving part 49. In this embodiment, an inner circumferential surface 10*f* of the rotational cup 10 is inclined downward (see, FIG. 2). Thus, even when the wafer W is incorrectly positioned on the rotational cup 10, the wafer W can be slid downward so that the wafer W can be reliably supported by the support pins 15.

Then, by driving and rotating the rotational shaft 31 by the rotary driving part 60, the base plate 30 and the rotational cup 10 are rotated, whereby the wafer W on the support pins 15 disposed on the rotational cup 10 is rotated (see, FIG. 1). The rotational shaft 31 is driven in rotation by a driving force imparted from the motor 60 to the pulley 62 through the driving belt 63.

At this time, a process liquid supplied from the process-liquid supply part 39 is supplied onto the lower surface of the wafer W (see, FIG. 1). Then, the process liquid supplied onto the lower surface of the wafer W is moved circumferentially outward by a centrifugal force generated by the rotation of the wafer W.

On the other hand, a nitrogen gas is supplied from the inert-gas supply port 47*a* formed in the central part of the top plate 40 (see, FIG. 1). Then, the nitrogen gas is supplied to a gap D2 between the wafer W and the rotational cup 10 via the upper surface of the wafer W (see, FIG. 2). Thus, the process liquid having reached the circumferential part of the wafer W can be prevented from shifting toward the upper surface of the wafer W through a space between the wafer W and the support pins 15 and a space between the wafer W and the rotational cup 10, which might be caused by the capillary phenomenon.

In this embodiment, disposed on the rotational cup 10 are the support pins 15 that project circumferentially inward so as to support the circumferential part of the lower surface of the wafer W. Thus, the rotational cup 10 can be disposed on a position near to the circumferential part of the wafer W (see, FIG. 2). As a result, the process liquid having been supplied to the lower surface of the wafer W can be prevented from spattering from the circumferential part of the wafer W.

In addition, the position of the upper surface of the wafer W supported by the support pins 15 can be made uniform with respect to a lower surface of the rotational cup 10 (the gap D2 between the wafer W and the rotational cup 10 can be made uniform at the all positions of the circumferential part of the wafer W) (see, FIG. 2). Thus, since a flow of the nitrogen gas flowing above the upper surface of the wafer W can be made uniform, the process liquid having reached the circumferential part of the wafer W can be more reliably prevented from shifting toward the upper surface of the wafer W through the space between the wafer W and the support pins 15 and the space between the wafer W and the rotational cup 10, which might be caused by the capillary phenomenon. That is to say, according to this embodiment, since the gap D2 between the wafer W and the rotational cup 10 can be made uniform at the all positions of the circumferential part of the wafer W, an amount of the nitrogen gas to be supplied to the gap D2 between the wafer W and the rotational cup 10 can be made uniform. Thus, an amount of the nitrogen gas required to prevent the shifting of the process liquid toward the upper surface of the wafer W can be readily determined, whereby the process liquid having reached the circumferential part of the wafer W can be more reliably prevented from shifting toward the upper surface of the wafer W.

Figure 5:
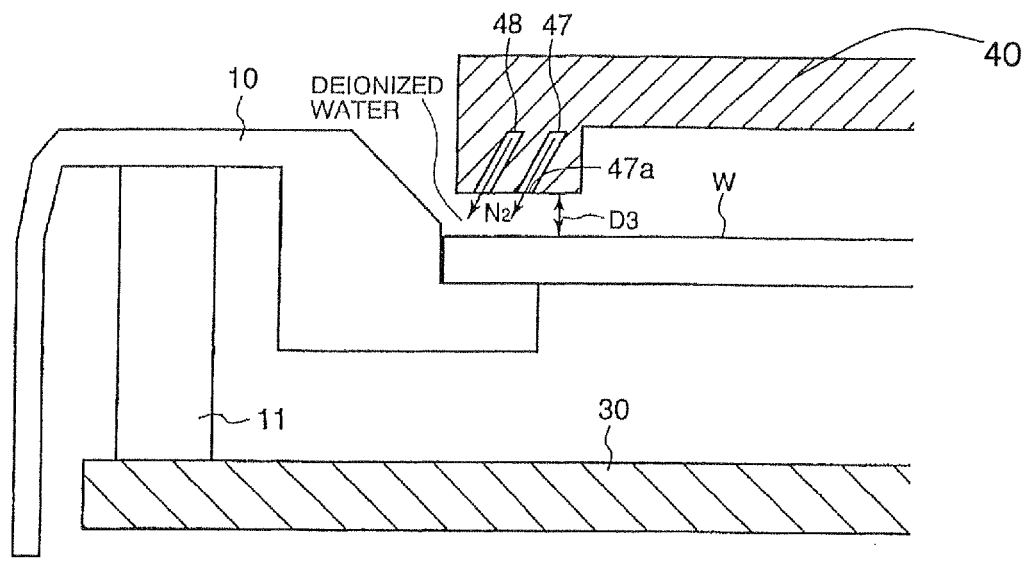
FIG. 5 is a schematically enlarged sectional view showing a rotational cup of a liquid processing apparatus in a modification of the first embodiment of the present invention and a vicinity of the rotational cup.
Figure 6:
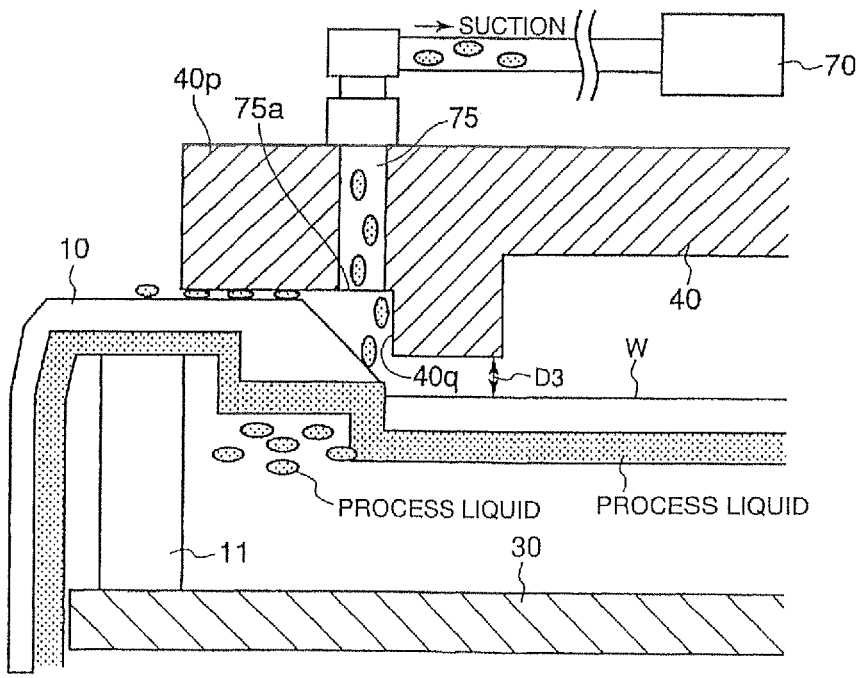
FIG. 6 is a schematically sectional view showing a flow of a process liquid in the vicinity of a rotational cup of a liquid processing apparatus in a second embodiment of the present invention.

In addition, since the position of the upper surface of the wafer W supported by the support pins 15 can be made uniform with respect to the lower surface of the rotational cup 10, a gap D3 between a lower end of the top plate 40 located on the lowered position and the upper surface of the wafer W can be made uniform at the all positions of the circumferential part of the wafer W (see, FIGS. 5 and 6). Thus, the nitrogen gas reaching the circumferential part of the wafer W via the lower end of the top plate 40 can be made more uniform.

According to this embodiment, since the support pins 15 and the rotational cup 10 are integrally formed with each other, the gap D2 between the wafer W supported by the support pins 15 and the rotational cup 10 can be reliably made uniform. Thus, a flow of the nitrogen gas flowing above the upper surface of the wafer W can be made more uniform, whereby the process liquid having reached the circumferential part of the wafer W can be more reliably prevented from shifting toward the upper surface of the wafer W.

In addition, according to this embodiment, since the spacer 11 and the rotational cup 10 are also integrally formed with each other, a height position of the wafer W supported by the support pins 15 can be made uniform with respect to a height position of the base plate 30 (a predetermined distance D1 can be maintained at the all positions of the circumferential part of the wafer W) (see, FIG. 2). As a result, a flow of the process liquid flowing below the lower surface of the wafer W can be made uniform, whereby a processing precision of the wafer W can be more improved.

In this embodiment, a process liquid to be supplied from the process-liquid supply mechanisms 37 and 39 onto the lower surface of the wafer W can be suitably changed. For example, the process-liquid supply mechanism 37 and 39 may firstly supply a diluted hydrofluoric-acid liquid (SC1), and then a deionized water (DIW).

When the aforementioned process for cleaning the wafer W by means of the process liquid is finished, the supply of the process liquid (e.g., deionized water) from the process-liquid supply part 39 is stopped.

Then, the rotational shaft 31 is rotated at a high speed by the rotary driving part 60. Thus, the wafer W on the support pins 15 is rotated at a high speed, so that the wafer W is dried (see, FIG. 1). Thereafter, the motor 61 of the rotary driving part 60 is stopped, and thus the rotation of the wafer W on the support pins 15 is stopped (see, FIG. 1).

Then, the top plate 40 is moved by the top-plate driving part 49 to an upper position other than the transfer position of the wafer W. Thereafter, the lift-pin plate 35 is moved to the lifted position by the lift-shaft driving part (not shown), so that the wafer W is positioned at the transfer position (lifted position).

Then, the wafer W is removed from the lift-pin plate 35 by the transfer robot (not shown). In this manner, the process for the one wafer W is completed.

In the above example, the inert-gas supply port 47a is formed in the central part of the top plate 40. However, not limited thereto, as shown in FIG. 5, for example, the inert-gas supply pipe 47 may be disposed in a circumferential part of the top plate 47 at a position opposed to the circumferential part of the wafer W.

In addition, a deionized-water supply part (deionized-water supply mechanism) 48 for supplying a deionized water into the gap D3 between the wafer W and the rotational cup 10 may be further disposed above the upper surface of the wafer W. Specifically, as shown in FIG. 5, for example, the deionized-water supply part 48 for supplying a deionized water may be disposed in the circumferential part of the top plate 40 at a position opposed to the circumferential part of the wafer W. Due to the provision of the deionized-water supply part 48, the circumferential part of the upper surface of the wafer W can be rinsed.

In the above example, the support pins 15 and the rotational cup 10 are integrally formed with each other. However, not limited thereto, the support pins 15 may be separated from the rotational cup 10, and the support pins 15 may be fixed to the rotational cup 10.

In addition, in the above example, the spacer 11 and the rotational cup 10 are integrally formed with each other. However, not limited thereto, the spacer 11 may be separated from the rotational cup 10, and the spacer 11 may be fixed on the rotational cup 10.

Second Embodiment

A second embodiment of the present invention is described with reference to FIG. 6 and FIGS. 7(a) and 7(b). In the second embodiment shown in FIG. 6 and FIGS. 7(a) and 7(b), a top plate 40 is provided with a projecting part 40p that projects circumferentially outward to be extended to a position above a rotational cup 10. In the projecting part 40p projecting circumferentially outward, there is extended a suction pipe 75 connected to a suction part 70 for imparting a suction force. An end of the suction pipe 75, which is opposed to the suction part 70, forms a suction port 75a for sucking a process liquid adhering to the projecting part 40p. A suction mechanism is constituted by the suction part 70 and the suction pipe 75. Other structures of the second embodiment are substantially the same as those of the first embodiment shown in FIGS. 1 to 5.

Figure 7:
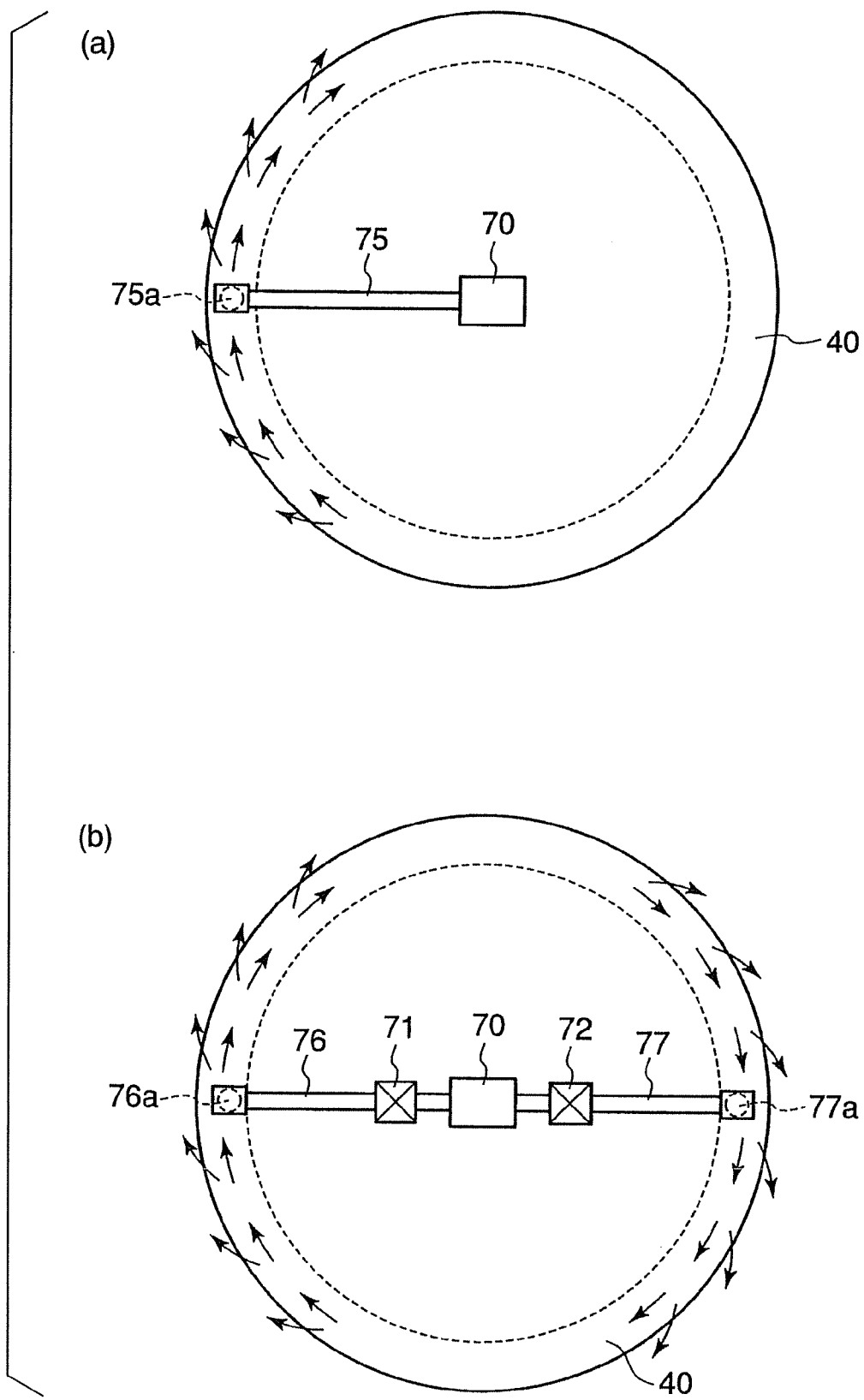
FIG. 7 is a top plan view showing the rotational cup and a suction mechanism of the liquid processing apparatus in the second embodiment of the present invention.

In the second embodiment shown in FIG. 6 and FIGS. 7(a) and 7(b), the same parts as those of the first embodiment shown in FIGS. 1 to 5 are shown by the same reference numbers, and detailed description thereof is omitted.

As shown in FIG. 6, the suction port 75a of the suction pipe 75 connected to the suction part 70 is formed in the projecting part 40p projecting circumferentially outward. As shown in FIG. 7(a), a rotational force is imparted to a deionized water (deionized water supplied from process-liquid supply mechanisms 37 and 39) adhering to a lower surface of the projecting part 40p and a lower outside surface 40q (see, FIG. 6) of the top plate 40, by a flow of an airflow generated by the rotation of a rotational cup 10. Thus, the process liquid adhering to the lower surface of the projecting part 40p and the lower outside surface 40q moves along the lower surface of the projecting part 40p and the lower outside surface 40q so as to be sucked from the suction port 75a.

The process liquid adhering to a position that is circumferentially outward the projecting part 40p projecting circumferentially outward (a position remote from the suction port 75a in the radial direction of the top plate 40) flows circumferentially outward from the projecting part 40p so as to be removed, by a flow of an airflow generated between the projecting part 40p and the rotational cup 10 (see, FIG. 6 and FIG. 7(a)). In addition, the process liquid adhering to the upper surface of the rotational cup 10 flows circumferentially outward from a space between the projecting part 40p and the rotational cup 10 so as to be removed, by a centrifugal force generated by the rotation of the rotational cup 10.

From these structures, even when the process liquid spatters upward the wafer W from a space between an inner circumferential edge of the rotational cup 10 and an outer circumferential edge of the wafer W so as to adhere to the lower surface of the projecting part 40p, the lower outside surface 40q, and the upper surface of the rotational cup 10 (see, FIG. 6), the process liquid can be reliably removed.

Thus, when a processed wafer W is moved by a transfer robot (not shown) below the top plate 40, the process liquid adhering to the lower surface of the projecting part 40p and the lower outside surface 40q of the top plate 40 can be prevented from dropping on the wafer W. Further, a wafer W, which is to be subsequently processed, can be prevented from being affected by the process liquid adhering to the lower surface of the projecting part 40p and the lower outside surface 40q.

Moreover, the lower surface of the projecting part 40p and the lower outside surface 40q can be cleaned by the process liquid moving along the lower surface of the projecting part 40p and the lower outside surface 40q. Thus, the lower surface of the projecting part 40p and the lower outside surface 40q can be maintained clean.

In the above example, the one suction port 75a is formed in the projecting part 40p projecting circumferentially outward. However, not limited thereto, as shown in FIG. 7(b), for example, two suction ports (a first suction port 76a and a second suction port 77a) may be formed in the projecting part 40p.

In this case, a first valve 71 capable of being opened and closed is disposed on a first suction pipe 76 whose one end, which is opposed to the suction part 70, forms the first suction port 76a, and a second valve 72 capable of being opened and closed is disposed on a second suction pipe 77 whose one end, which is opposed to the suction part 70, forms the second suction port 77a.

Thus, by adjusting the opening and closing conditions of the first valve 71 and the second valve 72, different kinds of process liquids can be sucked by the first suction port 76a and the second suction port 77a. For example, the first suction port 76a may be used for sucking a process liquid to be reused, and the second suction port 77a may be used for sucking a process liquid to be discharged. Alternatively, the first suction port 76a may be used for sucking a chemical liquid, and the second suction port 77a may be used for sucking a rinse liquid such as a deionized water.

When a process liquid is sucked by the first suction port 76a, the first valve 71 is opened while the second valve 72 is closed. On the other hand, when a process liquid is sucked by the second suction port 77a, the first valve 71 is closed while the second valve 72 is opened.

In the respective embodiments, although a process liquid is supplied to a central part of a lower surface of a wafer W, so that the overall lower surface and a side surface of the wafer W are processed, the present invention is not limited thereto. For example, a process liquid may be supplied to a circumferential part of the lower surface of the wafer W, so that a circumferential part of the lower surface and the side surface of the wafer W are processed.

The invention claimed is:

1. A liquid processing apparatus configured to process a lower surface and a side surface of an object to be processed, the liquid processing apparatus comprising:
   a process-liquid supply mechanism configured to supply a process liquid to the object to be processed;
   a drain mechanism configured to drain the process liquid having processed the object to be processed;
   a rotational cup disposed circumferentially outward the object to be processed, the rotational cup being configured to guide the process liquid having processed the object to be processed to the drain mechanism;
   a support part disposed on a lower surface of the rotational cup so as to project circumferentially inward from the lower surface of the rotational cup, the support part being configured to support a circumferential part of the object to be processed by a part projected circumferentially inward from the lower surface of the rotational cup; and
   a driving part configured to rotate the rotational cup.

2. The liquid processing apparatus according to claim 1 further comprising an inert-gas supply mechanism disposed above the object to be processed, the inert-gas supply mechanism being configured to supply an inert gas to a gap between the object to be processed and the rotational cup.

3. The liquid processing apparatus according to claim 2 further comprising a deionized-water supply mechanism disposed above the object to be processed, the deionized-water supply mechanism being configured to supply a deionized water to the gap between the object to be processed and the rotational cup.

4. The liquid processing apparatus according to claim 1 further comprising a top plate disposed above the object to be processed so as to cover the object to be processed,
   wherein:
   the top plate is provided with a projecting part projecting circumferentially outward to be extended to a part above the rotational cup: and
   the projecting part projecting circumferentially outward is provided with a suction mechanism having a suction port for sucking a process liquid adhering to the projecting part projecting circumferentially outward.

5. The liquid processing apparatus according to claim 4, wherein
   the suction port includes a first suction port and a second suction port.

6. The liquid processing apparatus according to claim 5, wherein:
   the first suction port sucks a process liquid to be reused; and
   the second suction port sucks a process liquid to be discharged.

7. The liquid processing apparatus according to claim 5, wherein:
   the process liquid supplied from the process-liquid supply mechanism to the object to be processed includes a chemical liquid and a rinse liquid;
   the first suction port sucks the chemical liquid; and
   the second suction port sucks the rinse liquid.

8. The liquid processing apparatus according to claim 1, wherein
   the support part and the rotational cup are integrally formed with each other.

9. The liquid processing apparatus according to claim 1 further comprising:

a base disposed below the rotational cup, the base being configured to be rotated by the driving part; and a spacer positioned between the base and the rotational cup;

wherein the spacer and the rotational cup are integrally formed with each other.

* * * * *